July 8, 1969 O. W. HATCHER 3,454,795

SEMICONDUCTIVE FIELD-CONTROLLED DIODE DEVICE

Filed Aug. 25, 1967

INVENTOR.
OWEN W. HATCHER

BY Flehr, Hohbach, Test, Albritton & Herbert

ATTORNEYS

United States Patent Office 3,454,795
Patented July 8, 1969

3,454,795

SEMICONDUCTIVE FIELD-CONTROLLED DIODE DEVICE

Owen W. Hatcher, Sunnyvale, Calif., assignor to Teledyne, Inc., Mountain View, Calif., a corporation of Delaware Filed Aug. 25, 1967, Ser. No. 663,299
Int. Cl. H03k *19/08*
U.S. Cl. 307—304 2 Claims

ABSTRACT OF THE DISCLOSURE

A semiconductive device which includes a P-type wafer having a silicon dioxide passivating layer. Inset into it is an N-type region which has inset therein a P-type region. The N and P regions form two PN junctions terminating at the silicon dioxide layer. An aluminum metallized overlay makes ohmic contact with the P-type inset region and extends over both of these junctions and a portion of the N-type region. Application of the proper voltage inverts the surface region of the N-type region and conduction is allowed between the two P regions through the N surface region. A load is connected between the wafer itself and P-type inset region. The PN junction between the wafer and N-type inset region is reversed biased.

*Specification*

The present invention is directed to a semiconductive device and more specifically to a device having a field-controlled diode.

With the advent of integrated circuits, there has arisen a need for individual devices which are compatible with such circuits; moreover, this compatibility should extend to both the structure and internal parameters of the integrated circuit.

Accordingly, it is an object of the present invention to provide an improved semiconductive device having triode capabilities which are compatible with integrated circuits.

The semiconductive device of the present invention includes a semiconductive wafer of one conductivity type having a dielectric film overlying a major surface. A first region of opposite conductivity type extends inwardly from the major surface and forms a first PN junction. A second region of the one conductivity type is inset into the first region and forms a second PN junction. The second region is smaller than the first region to allow a predetermined surface portion of the first region to be in close juxtaposition with the dielectric film on the major surface. A conductive layer overlies the dielectric film and a part of the predetermined surface portion of the first region. The conductive layer also extends over the second region and makes ohmic contact therewith and extends over at least a portion of the two junctions. Means including the portion of the conductive layer overlying the predetermined surface portion provide a depletion field in the portion to invert the conductivity of such portion whereby a conductive path is created between the second region and the wafer. Load means are ohmically coupled between the conductive layer and the wafer.

Other objects of the invention will appear from the following description.

Referring to the drawings.

Figure 1:
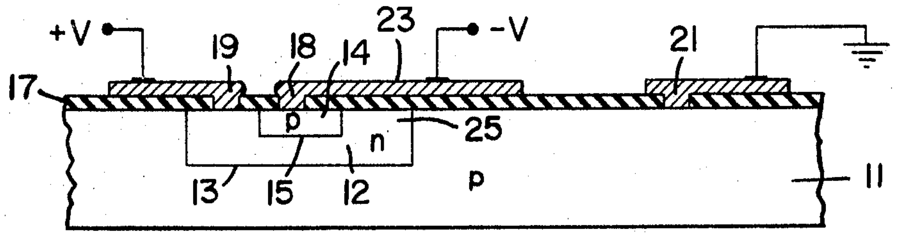
FIGURE 1 is a cross-sectional view of a semiconductive device embodying the present invention.

Referring now to FIGURE 1, a semiconductive wafer 11 of P-type conductivity material, for example, has inset into it a first region 12 of opposite conductivity type (N-type) which forms a first NP junction 13 with wafer 11.

A second semiconductive region 14 is inset into the first region 12 and includes material of P-type conductivity. Region 14 forms a second PN junction 15 with the N-type material of region 12. A passivating layer 17 of, for example, silicon dioxide, covers the entire top major surface of wafer 11 and regions 14 and 12, except where interrupted by ohmic contacts. These include an ohmic contact 18 with region 14, contact 19 with region 12 and a contact 21 with the wafer 11. Both PN junctions 15 and 13 terminate at passivating layer 17.

Figure 2:
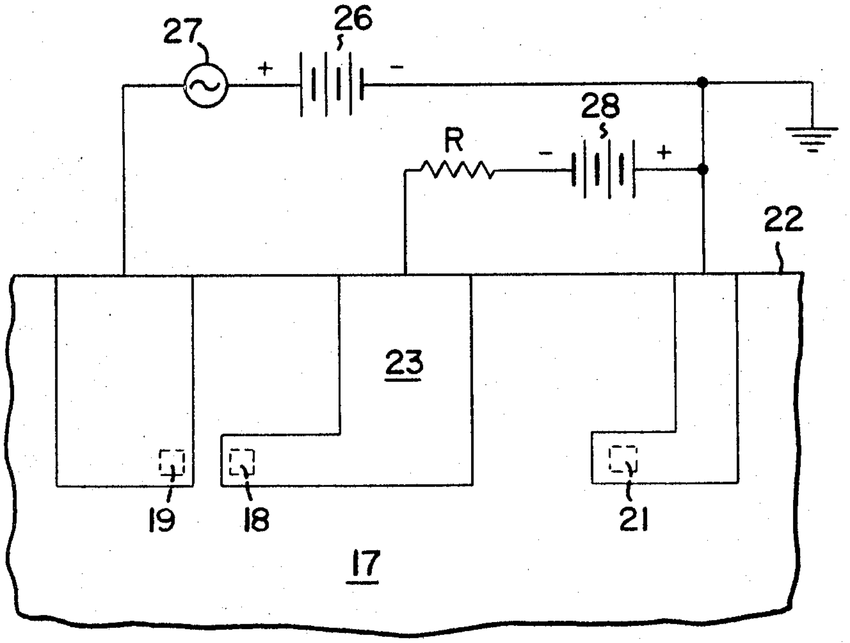
FIGURE 2 is a top view of FIGURE 1 showing associated circuitry in schematic form.

Referring now also to FIGURE 2, ohmic contacts 19 and 21 extend to an edge 22 of the semiconductive wafer for coupling to appropriate electrical leads. This coupling is provided by an aluminum overlay metallization process where an aluminum conductive strip overlies the passivating layer 17. In the case of ohmic contact 18 a conductive layer 23 also extends to edge 22 but in addition extends over the surface portion 25 of region 12 which is in close juxtaposition to the passivating surface 17 and over the upward extending terminations of PN junctions 13 and 15.

A signal source 27 and a variable undirectional voltage source 26 having polarities as indicated for this arrangement of conductivity types is coupled between ohmic contacts 18 and 19 and their associated conductive layers. A load R and a source of unidirectional potential 28 having a polarity as indicated are coupled between conductive layer 23 and the ohmic contact 21.

*Operation*

With the junction 13 reverse biased, any charge developed at the interface between aluminum layer 23 and silicon dioxide passivating surface 17 will generate a depletion in region 12 at surface region 25. With a sufficient depletion, inversion of surface region 25 occurs and a conductive path is established across the PN junctions 15 and 13 between regions 11 and 14.

The voltage at which this inversion occurs can be regulated by control of the surface resistivity of region 25 and the thickness of oxide passivating layer 17. A resulting curve 29 is shown in FIGURE 3.

Figure 3:
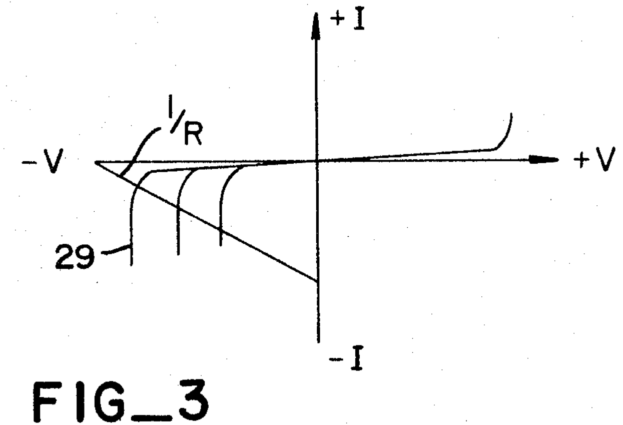
FIGURE 3 shows characteristic curves useful in understanding the invention.

The family of characteristic curves as shown in FIGURE 3 may be achieved by varying unidirectional voltage source 26 to change the potential of region 12. By varying this so-called threshold voltage, a family of curves is produced up to the breakdown point of the reverse bias on PN junction 13. The line $1/R$ indicates the variation of load current with a change in voltage source 26.

It is obvious from the curves in FIGURE 3 that the device also has power gain because of its high input impedance. This is true, however, only so long as all junctions are kept in reverse bias.

Thus, the device of the present invention operates in a manner similar to a triode vacuum tube. The principle of operation may also be analogized to that of both a diffused channel-type field effect transistor (FET) and an insulated gate type field effect transistor; namely the input impedance of the device is similar to that of a diffused FET and the conducting channel is induced by an applied electric field as in an insulated gate FET.

I claim:

1. A field-controlled semiconductive device comprising, a semiconductive wafer of one conductivity type having a dielectric film overlying a major surface, a first region of opposite conductivity type extending inwardly from said major surface and forming a first P-N junction terminating only at said surface, a second region of said one conductivity-type inset into said first region from said surface and forming a second P–N junction terminating only at said surface, said second region being smaller than said first region to allow a predetermined surface portion of said first region to be in close juxtaposition with said dielectric film on said major surface, a conductive layer on said dielectric film overlying said predetermined surface portion of said first region, said conductive layer also overlying said second region and making ohmic contact therewith and overlying at least a portion of the terminations of said first and second P-N junctions at said surface, a contact to said wafer on said surface spaced from said first P-N junction, means including said portion of said conductive layer overlying said predetermined surface portion for reverse biasing said first P-N junction and for providing a depletion field in said portion to invert the conductivity of such portion whereby a conductive path is created adjacent said major surface between said second region and said wafer, and load means ohmically connected between said conductive layer and second contact to said wafer.

2. A device as in claim 1 including means making ohmic contact to said first region for varying the potential of such region to thereby vary the conductive characteristics of said surface portion.

References Cited

UNITED STATES PATENTS

| | | | |
|---|---|---|---|
| 2,981,877 | 4/1961 | Noyce | 317—235 |
| 3,271,201 | 9/1966 | Pomerantz | 148—33.3 |
| 3,356,858 | 12/1967 | Wanlass | 307—88.5 |
| 3,412,297 | 11/1968 | Amlinger | 317—235 |

OTHER REFERENCES

Steiner et al.: "Investigation of Unwanted Conductivity Paths in a Transistor," IBM Technical Disclosure Bulletin, vol. 6, No. 1, June 1963, pp. 115–116.

JAMES W. LAWRENCE, *Primary Examiner.*

J. R. SHEWMAKER, *Assistant Examiner.*

U.S. Cl. X.R.

317—235